United States Patent [19]

Yoshimura

[11] Patent Number: 4,819,206

[45] Date of Patent: Apr. 4, 1989

[54] OPTICAL RECORDING SYSTEM

[75] Inventor: Motomu Yoshimura, Amagasaki, Japan

[73] Assignee: Mitsubishi Denki K.K., Tokyo, Japan

[21] Appl. No.: 89,083

[22] Filed: Aug. 25, 1987

[51] Int. Cl.$^4$ .......................... G11C 13/00; G02F 1/26
[52] U.S. Cl. ...................................... 365/106; 365/120
[58] Field of Search .............. 365/106, 121, 122, 119, 365/120, 112

[56] References Cited

U.S. PATENT DOCUMENTS 3,614,200 10/1971 Taylor ............................. 365/121 X
3,871,745 3/1975 Waku et al. ..................... 365/121 X
4,101,976 7/1978 Castro et al. ......................... 365/119

OTHER PUBLICATIONS

A. I. M. Dicker et al, "Stark Effect on the $S_1 \leftarrow S_0$ Transition, etc.", *Chemical Physics Letters*, vol. 94, No. 1, pp. 14–20, Jan. 7, 1983.
I. Tsunoda et al., Eikisho No Saishin Gijitsu (Advanced Technology of Liquid Crystal), Kogyo Chosakai, pp. 1051–112.

Primary Examiner—Joseph A. Popek
Attorney, Agent, or Firm—Takeuchi Patent Office

[57] ABSTRACT

An optical recording system which includes a recording medium of which the light absorption spectrum changes when exposed to light; a first transparent substrate provided on a first side of the recording medium; a plurality of first parallel transparent elongated electrodes provided on the first substrate; a second substrate provided on a second side of the recording medium opposite to the first side; a plurality of second parallel elongated electrodes provided on the second substrate in the direction perpendicular to the first elongated electrodes so as to form a plurality of recording spots at their intersections; a light source for directing a light beam to a plurality of the recording spots on the recording medium; and an electric field applying device for controlling the field strength of an electric field applied to a plurality of the recording spots to control the degree of change in the light absorption spectrum so that multiplex information recording is made in a dimension of electric field.

8 Claims, 4 Drawing Sheets

OPTICAL RECORDING SYSTEM

BACKGROUND OF THE INVENTION

1. Field of the Invention

The present invention relates generally to apparatus for optically recording information, especially to apparatus for multiplexing such information recording in a dimension of electric field.

2. Description of the Prior Art

FIG. 6 shows a conventional optical recording system such as shown by R. A. Bartolini, *Laser Kenkyu*, Vol. 11, No. 8, pp 548–555. It consists of a recording laser source 1, an objective lens 6, and a disk 3 consisting of a recording medium 3a, such as a tellurium compound, and a support 3c. Information is recorded on the recording medium 3a as a pit 7.

In operation, while the disk 3 is rotated, the laser beam 1b modulated with information in the laser source 1 is focused on the recording medium 3a by the objective lens 6 to open a pit 7 by heat. Such a thermal writing system with a laser beam permits the recording of only a bit of information per pit. Consequently, the amount of information recorded per unit area of the recording medium is determined by the number of pits formed per unit area of the recording medium. In the existing laser recording system, the diameter of a laser spot is approximately one micron so that the diameter of a pit is about one micron. Consequently, the maximum recording capacity per square centimeters is $10^8$ bits/cm$^2$.

In addition, the above system is unable to make a plurality of pits simultaneously on the recording medium 3a but only one at a time sequentially.

SUMMARY OF THE INVENTION

It is an object of the invention to provide an optical recording system capable of writing at least two bits of information per recording spot.

It is another object of the invention to provide an optical recording system having a recording capacity of at least $10^8$ bits/cm$^2$.

It is still another object of the invention to provide an optical recording system capable of recording information on a plurality of recording spots at the same time.

According to one aspect of the invention there is provided an optical recording system which comprises a recording medium of which the light absorption spectrum changes when exposed to light; a first transparent substrate provided on a first side of said recording medium; a plurality of first parallel transparent elongated electrodes provided on said first substrate; a second substrate provided on a second side of said recording medium opposite to said first side; a plurality of second parallel elongated electrodes provided on said second substrate in the direction perpendicular to said first elongated electrodes so as to form a plurality of recording spots at their intersections; a light source for emitting a light beam to which a plurality of said recording spots on said recording medium are exposed; and an electric field applying device for controlling the field strength of an electric field applied to a plurality of said recording spots to control the degree of change in said light absorption spectrum so that at least two bits of information in a dimension of electric field may be written on a single recording spot. In addition, the width of the elongated electrodes may be determined according to the amount of information to be written in a dimension of electric field. Preferably, it is no more than one micron so that the recording capacity may be higher than the present limit or $10^8$ bits/cm$^2$.

According to another aspect of the invention there is provided an optical recording system which further comprises a beam expander for expanding a light beam of the light source to expose at least two recording spots to light so that information may be written on at least two recording spots at the same time.

Unlike the conventional optical recording system which opens pits on a recording medium by the heat of a focused laser beam in such a manner that a bit of information may be recorded per recording spot, the optical recording system according to the invention uses a recording medium capable of exhibiting the Stark effect by which the light absorption spectrum is changed by the absorption of light. The degree of the change depends on the field strength applied to the recording medium so that at least two bits of information may be recorded on a single recording spot by applying a mode of electric field having at least two different field strengths while the recording medium is exposed to light. When the electric field mode consists of N field strengths, there are N different absorption lines appearing in the absorption spectrum, thus providing N degree multiplex recording in an electric field dimension or (N+1) bits of recording capacity per spot (including E=0).

Another important factor for determining the recording capacity is the number of recording spots (M) per unit area of a recording medium. The overall recording capacity is given by the product of the above multiplexing degree N and the number of recording spots M or M×N (bits/cm$^2$). According to the invention, the recording spot is a point at which two elongated electrodes, each formed on a separate substrate, intersect each other. Consequently, the number of recording spots M in unit area is determined by the sum of two values; the elongated electrode width W1 and the distance W2 between them or W1+W2. Thus, it is possible to provide an optical recording system having a recording capacity greater than $10^8$ bits/cm$^2$, which is the maximum recording capacity of the existing optical recording system, by making the electrodes with such values W1 and W2 that M may be sufficiently large for N×M to exceed $10^8$ bits/cm$^2$.

To write information or recording spots, electrical signals in a mode of electrical field of which the field strength is modulated with the information to be recorded are transmitted to the one-to-one corresponding recording spots to change the absorption spectrum on each spot under exposure to a laser beam, thereby recording the respective pieces of information on the corresponding recording spots. Since the electrical fields are used to record information of respective spots, the laser may have only a single emission wavelength in the region sufficient to change the absorption spectrum of a recording medium.

The electrode network according to the invention may be driven by a dynamic driving circuit which is commonly used to transmit electrical signals in an electric field mode to respective pixels of a liquid crystal display. That is, the dynamic driving circuit may be used for simultaneous transmission of electrical signals to respective recording spots while a wide area S (cm$^2$) of the recording medium is exposed to an expanded laser beam so that information may be recorded on the S×M recording spots at the same time.

To read the recorded information, electric fields having a continuous field strength spectrum are applied to respective recording spots to sense the absorption spectrum, or emission and/or reflection spectrum of each recording spot so that the recorded information may be detected from the sensed spectrum change.

Other objects, features, and advantages of the invention will be apparent from the following description taken in conjunction with the accompanying drawings:

DESCRIPTION OF THE PREFERRED EMBODIMENTS

Figure 1:
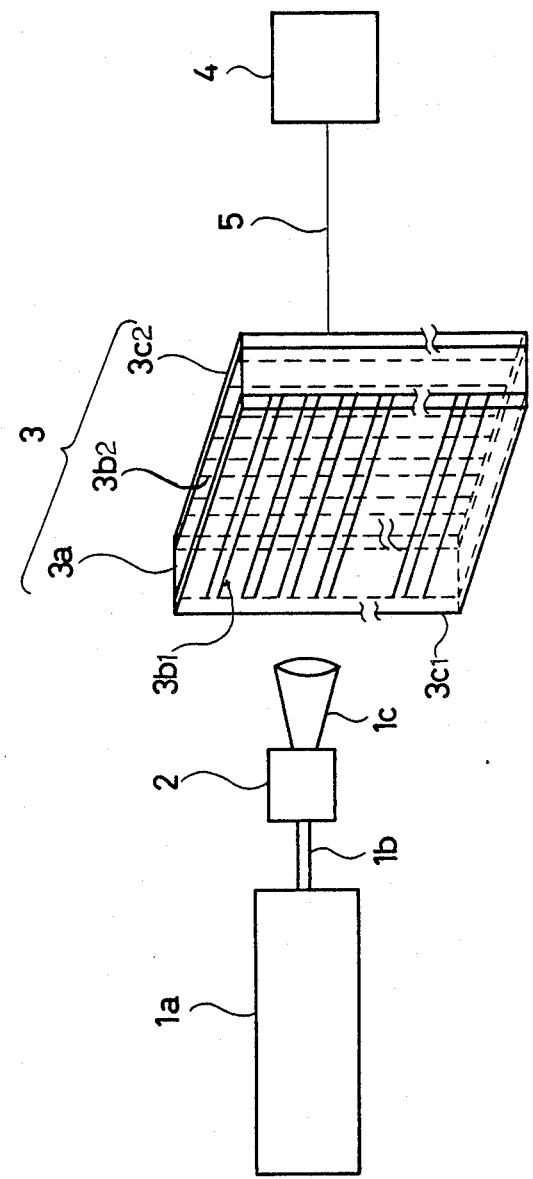
FIG. 1 is a schematic diagram of an optical recording system according to an embodiment of the present invention.

Referring now to FIG. 1 there is shown an optical recording system embodying the present invention. It consists of a laser light source $1a$ for emitting a laser beam $1b$, a beam expander 2 for providing an expanded laser beam $1c$, a recording medium $3a$, a pair of transparent substrates $3c1$ and $3c2$ provided opposite sides of the recording medium $3a$, a plurality of first parallel transparent elongated electrodes $3b1$ formed on the transparent substrate $3c1$, a plurality of second parallel transparent elongated electrodes $3b2$ formed on the transparent substrate $3c2$, an electric field applying device 4, and a lead wire 5. The first and second elongated electrodes $3b1$ and $3b2$ are arranged crosswise so as to make a plurality of recording spots at their intersections.

EXAMPLE 1

Figure 2:
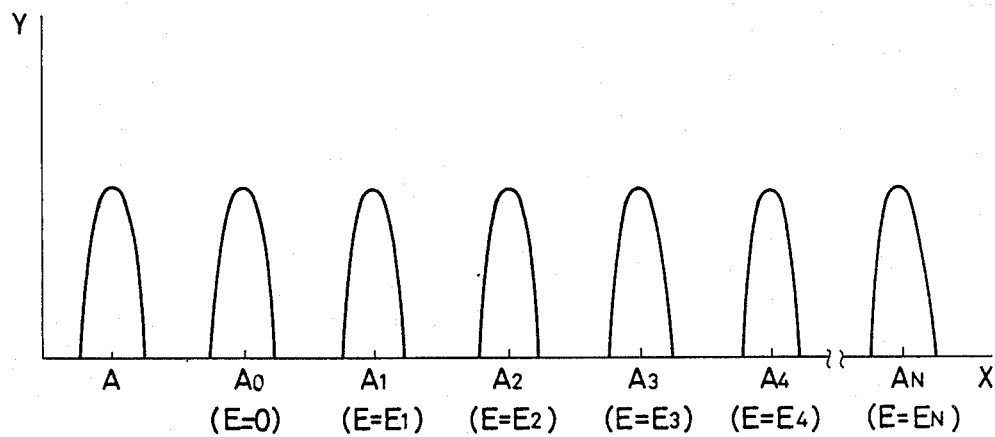
FIG. 2 is a graph showing the absorption spectrum of a recording medium useful for the invention.

The recording medium $3a$ in this embodiment is made of a photochromic compound of which the light absorption peak is able to shift by the absorption of light. As FIG. 2 shows, the absorption peak of a photochromic compound is shifted from A to A0 when it is exposed to light but no electric field is applied thereto. The X-axis and Y-axis represent the wavelength (nm) and the absorption degree, respectively. The absorption peak of the compund exposed to light is shifted to A1, A2, A3, ..., AN as the electric field strength (E) applied increases to E1, E2, E3, ..., EN. This is called the Stark effect.

Figure 3:
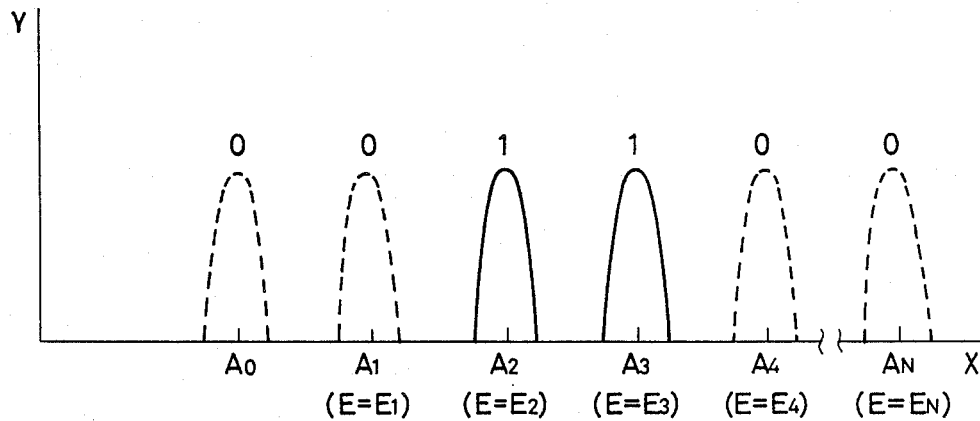
FIG. 3 is a graph showing the absorption spectrum of the recording medium of FIG. 2 after (N+1) bits of information have been recorded.

A laser beam $1b$ generated in the laser light source $1a$ so as to have the absorption peak A of FIG. 2 is expanded in the beam expander 2, and an expanded laser beam $1c$ is directed to the recording medium $3a$. Under these conditions, an electric field of which the field strength is modulated with information in the electric field applying device 4 is applied to a spot at which the first and second transparent electrodes $3b1$ and $3b2$ intersect each other. For example, when a mode of field strengths applied is E=E2 and E=E3, absorption peaks A2 and A3 appear in the absorption spectrum as shown in FIG. 3. Thus, (N+1) bits of information such as (0, 0, 1, 1, 0, ..., 0) may be recorded in the single recording spot by taking absorption peaks (A) as ones in the binary code.

Since the expanded laser beam $1c$ covers many recording spots, it is possible to make simultaneous recording of a plurality of recording spots, (N+1) bits of information for each spot, by simultaneously applying respective modes of electric field modulated with respective pieces of information using the well known dynamic driving technique. The detailed configuration of the dynamic driving circuitry is described by Ichiro Tsunoda and Shoichi Matsumoto, *Latest Liquid Crystal Technology,* Kogyo Chosakai, pp 105–112.

The photochromic compounds useful for the invention include spiropyrans, furguidos, azobenzenes, complex compounds, such as ruthenium or mercury complex compound, and other common photochromic compounds.

EXAMPLE 2

Figure 4:
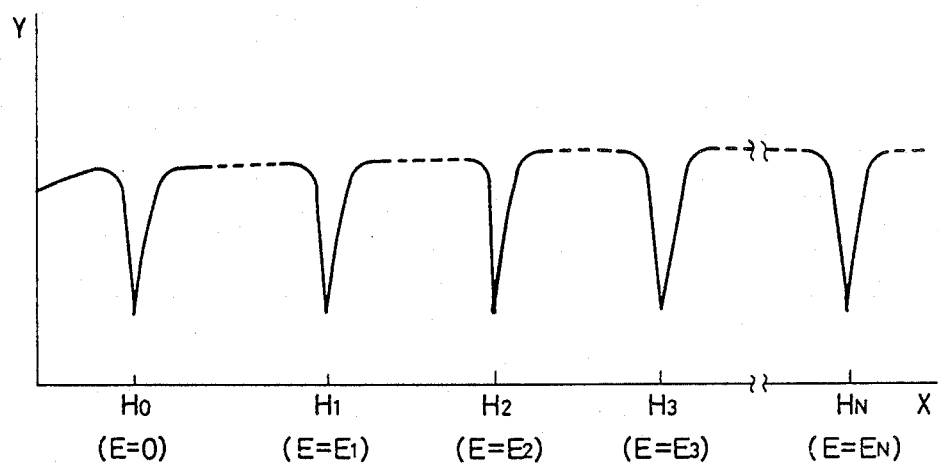
FIG. 4 is a graph showing the absorption spectrum of another recording medium useful for the invention.

The recording medium $3a$ in this embodiment is made of a compound exhibiting the so-called hole burning phenomenon in which absorption lines (holes) of certain wavelengths are removed from the absorption spectrum of the compound. FIG. 4 shows an absorption hole spectrum formed when a hole burning recording medium $3a$ is exposed to a laser beam. When no electric field is applied (E=0), an absorption hole appears at a wavelength H0. As the field strength is increased to E=E1, E2, E3, ..., EN, the location of an absorption hole is shifted to H1, H2, H3, ..., HN, producing an absorption hole spectrum such as shown in FIG. 4.

Figure 5:
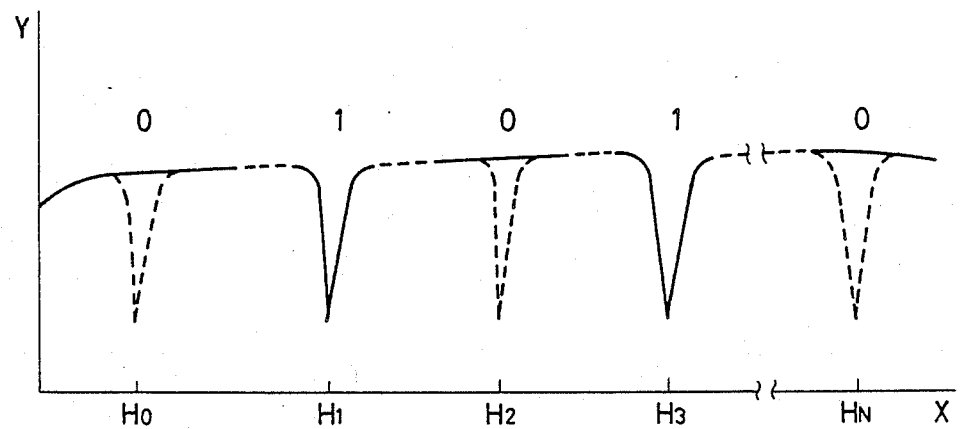
FIG. 5 is a graph showing the absorption spectrum of the recording medium of FIG. 4 after (N+1) bits of information have been recorded.
Figure 6:
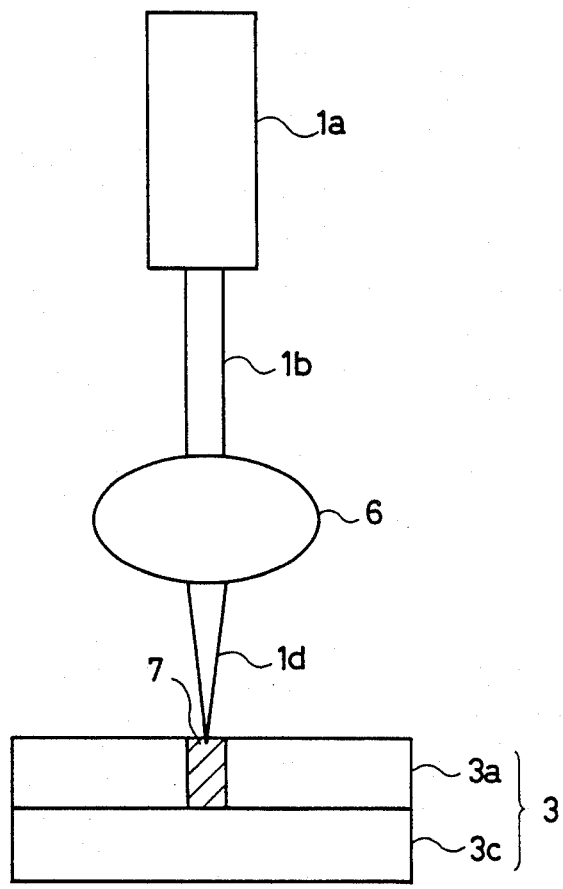
FIG. 6 is a schematic diagram of a conventional optical recording system.

A laser beam $1b$ generated in the laser source $1a$ so as to have a wavelength H0 is expanded in the beam expander 2, and the expanded laser beam $1c$ is directed to the recording medium $3a$. Under these conditions, an electric field modulated with information is applied to a recording spot at the intersection of first and second transparent electrodes $3b1$ and $3b2$. For example, when a mode of field strengths E=E1 and E=E3 is applied to a recording spot, absorption holes appear at wavelengths H1 and H3 in the absorption spectrum as shown in FIG. 5. Thus, (N+1) bits of information, such as (0, 1, 0, 1, ..., 0), may be recorded in the recording spot by taking absorption holes as ones in the binary code.

Similarly to Example 1, a laser beam $1b$ is expanded in the beam expander 2, and the expander laser beam $1c$ is directed to the recording medium 3 to cover a plurality of spots at the same time while respective electric field modulated with respective pieces of information are applied to the spots to record (N+1) bits of information in each spot at the same time.

The hole burning compounds useful for the recording medium $3a$ include chlorines, porphyrins, phthalocyanines, quinizarins, aminoacridines, perillenes, alkali halides, and other common hole burning materials.

The recording capacity of the photochromic or hole burning compound, or the maximum number of absorption peaks or holes produced in the photochromic or hole burning compound by the application of an electric field is equal to the number of energy levels (N) corresponding to the peak or hole locations. As a result, the larger the number of energy levels (N), the larger the maximum number of peaks or holes produced, and the larger the separation gap of energy levels, the easier the increase in the number of peaks or holes. To ensure such conditions, it is preferred to keep the recording medium 3a at as low a temperature as possible.

The recorded information may be read by measuring changes in the absorption spectrum either directly or by measuring changes in the emission and/or reflection spectrum. To read the recorded information by measuring the emission or reflection spectrum, the substrate and electrodes on the side opposite to the incident side of a recording laser beam are not necessarily treasnsparent.

As has been described above, according to the invention, a plurality of bits of information may be recorded in a single recording spot by controlling changes in the absorption spectrum of a recording medium, of which the absorption spectrum changes with the field strength applied thereto. The elongated transparent electrodes placed on opposite sides of a recording medium in a cross form to make recording spots at their intersections may be made without difficulty by the well known submicron microscopic processing technique to provide a spot density of $10^8$ spots/cm$^2$, which is equal to the present maximum recording spot density or recording capacity of $10^8$ bits/cm$^2$ by the conventional one-bit-per-spot recording technology. It is easy to break through this recording capacity limit in the existing optical recording system by adding a multiple of bits of information recorded to the same spot by means of multiplex recording technique in an electric field dimension according to the invention.

The electrode network of the invention may be driven by the dynamic driving technique so that the simultaneous transmission of electrical signals to respective recording spots is made without difficulty. As a result, it is possible to make simultaneous recording of information of a plurality of spots by expanding a laser beam and directing the expanded laser beam to the plurality of spots. In order to make one million recording spots in an area of one square millimeters, it is sufficient to make only 1,000 parallel elongated electrodes in one millimeter on a substrate by the microscopic processing technique.

By contrast, if each spot is made with a pair of independent electrodes, one million pairs of electrodes and two millions lead wires are necessary, and the simultaneous transmission of electrical signals to respective recording spots is made by the static driving technique. This is not only very difficult but also makes the electrode and lead patterns too complex to increase the recording density.

Since the multiplex recording is achieved in a dimension of electric field, the wavelength of a recording laser beam is not necessarily variable or tunable. However, of course, it is possible to use a tunable laser in this system making use of an additional dimension of wavelength for larger degrees of multiplex recording and higher recording capacity.

As has been described above, with the optical recording system according to the invention, it is possible to increase not only the recording capacity over the $10^8$ bits/cm$^2$ present limit but also the recording speed of information by the simultaneous recording on a plurality of spots. In addition, a laser with a single emission wavelength may be used.

While a preferred embodiment of the invention has been described above using specific terms, such description is for illustrative purpose only, and it is to be understood that changes and variations may be made without departing from the spirit and scope of the invention as recited in the following claims.

What is claimed is:

1. An optical recording system which comprises:
   a recording medium of which the light absorption spectrum is changed when exposed to light;
   a plurality of first parallel transparent elongated electrodes provided on a front face of said recording medium;
   a plurality of second parallel elongated electrodes provided on a back face of said recording medium in the direction perpendicular to said first elongated electrodes so as to form a plurality of recording spots at their intersections;
   a light source for emitting a light beam sufficiently thick to cover at least one of said recording spots on said recording medium; and
   electric field applying means for controlling the field strength of an electric field applied to said at least one recording spot to control the degree of change in said light absorption spectrum due to the Stark effect so that multiplex information recording is made in a dimension of electric field.

2. An optical recording system according to claim 1, which further comprises a beam expander for expanding said light beam from said light source to expose said plurality of recording spots to light.

3. An optical recording system according to claim 1, wherein said recording medium is made of a photochromic compound of which the light absorption peak is able to shift by the absorption of light.

4. The optical recording system of claim 3, wherein said photochromic compound is selected from the group consisting of spiropyrans, furguidos, azobenzenes, and ruthenium or mercury complex compound.

5. An optical recording system according to claim 1, wherein said recording medium is made of a hole burning compound of which the absorption holes at absorption wavelengths are removed from the light absorption spectrum.

6. The optical recording system of claim 5, wherein said hole burning compound is selected from the group consisting of chlorines, porphyrins, phthalocyanines, quinizarins, aminoacridines, perillenes, and alkali halides.

7. The optical recording system of claim 1, wherein said electric field applying means is a dynamic driving circuit thereby providing simultaneous transmission of signals to a plurality of recording spots.

8. The optical recording system of claim 1, wherein said light source is a tunable laser thereby increasing the degree of multiplex recording capacity.

* * * * *